(12) United States Patent
Kikkawa et al.

(10) Patent No.: US 7,795,622 B2
(45) Date of Patent: Sep. 14, 2010

(54) COMPOUND SEMICONDUCTOR DEVICE

(75) Inventors: Toshihide Kikkawa, Kawasaki (JP);
Kenji Imanishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 77 days.

(21) Appl. No.: 12/059,708

(22) Filed: Mar. 31, 2008

(65) Prior Publication Data
US 2008/0237606 A1 Oct. 2, 2008

(30) Foreign Application Priority Data
Mar. 30, 2007 (JP) ............................. 2007-094824

(51) Int. Cl.
*H01L 29/72* (2006.01)

(52) U.S. Cl. .............................. 257/76; 257/20; 257/24; 257/27; 257/94; 257/190; 257/194; 257/213

(58) Field of Classification Search .................. 257/20, 257/24, 27, 76, 94, 190, 192, 194, 213
See application file for complete search history.

(56) References Cited

U.S. PATENT DOCUMENTS

| 6,531,718 | B2 | 3/2003 | Inoue et al. | |
|---|---|---|---|---|
| 7,615,774 | B2 | 11/2009 | Saxler | |
| 2001/0020700 | A1* | 9/2001 | Inoue et al. | 257/20 |
| 2004/0155260 | A1* | 8/2004 | Kuzmik | 257/192 |
| 2005/0133816 | A1 | 6/2005 | Fan et al. | |
| 2006/0244010 | A1 | 11/2006 | Saxler | |

FOREIGN PATENT DOCUMENTS

| JP | 2006-32524 A | 2/2006 |
|---|---|---|
| JP | 2006-114653 A | 4/2006 |
| WO | 2004/017432 A1 | 2/2004 |

OTHER PUBLICATIONS

European Search Report dated Dec. 8, 2009, issued in corresponding European Application No. 08153474.
Liu, J et al., "DC and RF Characteristics of AlGaN/GaN/InGaN Double-Heterojunction HEMTs," IEEE Transactions on Electron Devices, IEEE Service Center, Jan. 1, 2007, pp. 2-10, vol. 54, No. 1, Pisacataway, NJ, USA.
Palacios, T et al., "AlGaN/GaN HEMTs with an InGaN-based Back-Barrier," Device Research Conference Diges, 2005, 63rd Santa Barbara, CA, Jun. 20, 2005, pp. 181-182, vol. 1, Pisacataway, NJ, USA.

* cited by examiner

*Primary Examiner*—Edward Wojciechowicz
(74) *Attorney, Agent, or Firm*—Westerman, Hattori, Daniels & Adrian, LLP

(57) ABSTRACT

A compound semiconductor device having a transistor structure, includes a substrate, a first layer formed on the substrate and comprising GaN, a second layer formed over the first layer and containing InN whose lattice constant is larger than the first layer, a third layer formed over the second layer and comprising GaN whose energy bandgap is smaller than the second layer, and a channel region layer formed on the third layer.

17 Claims, 8 Drawing Sheets

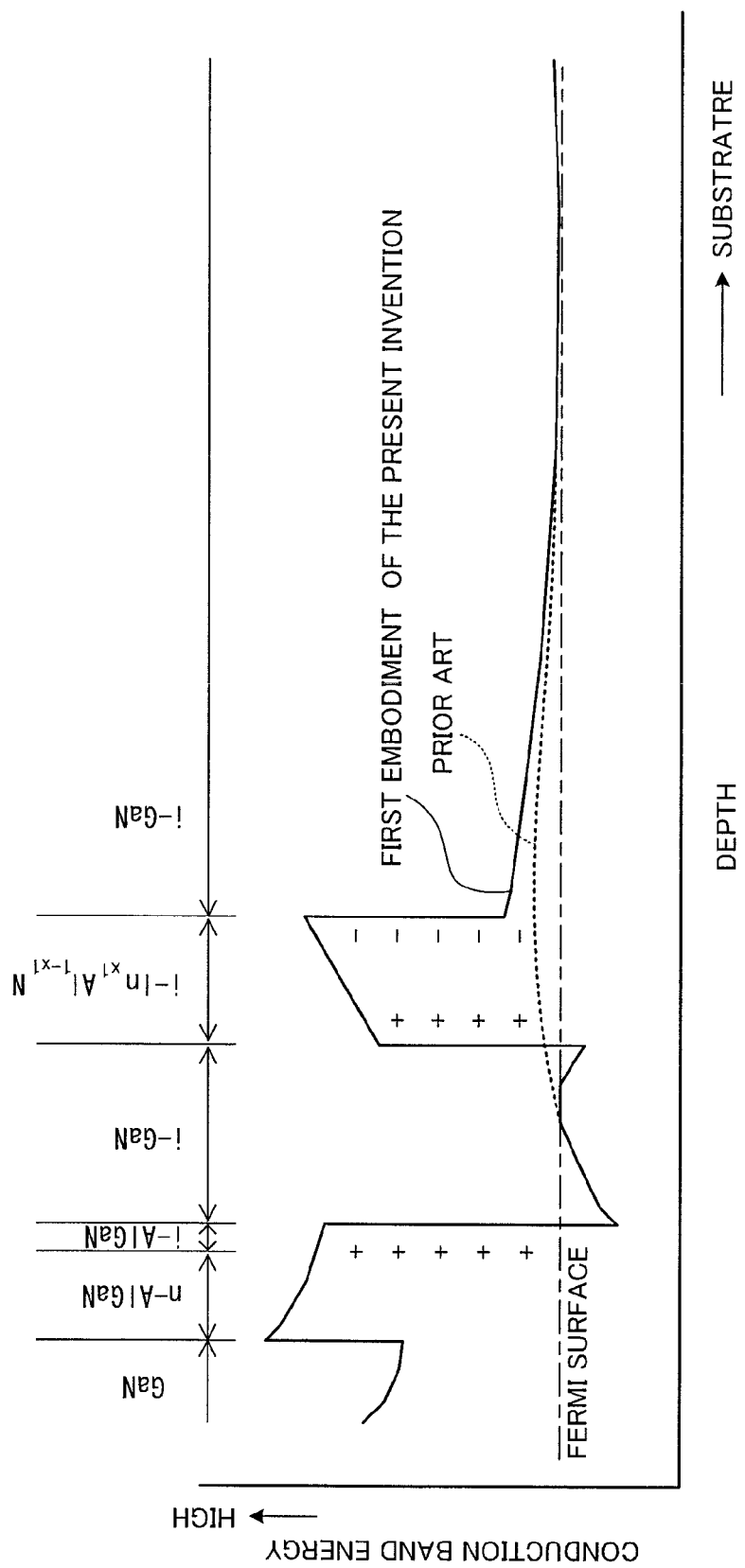

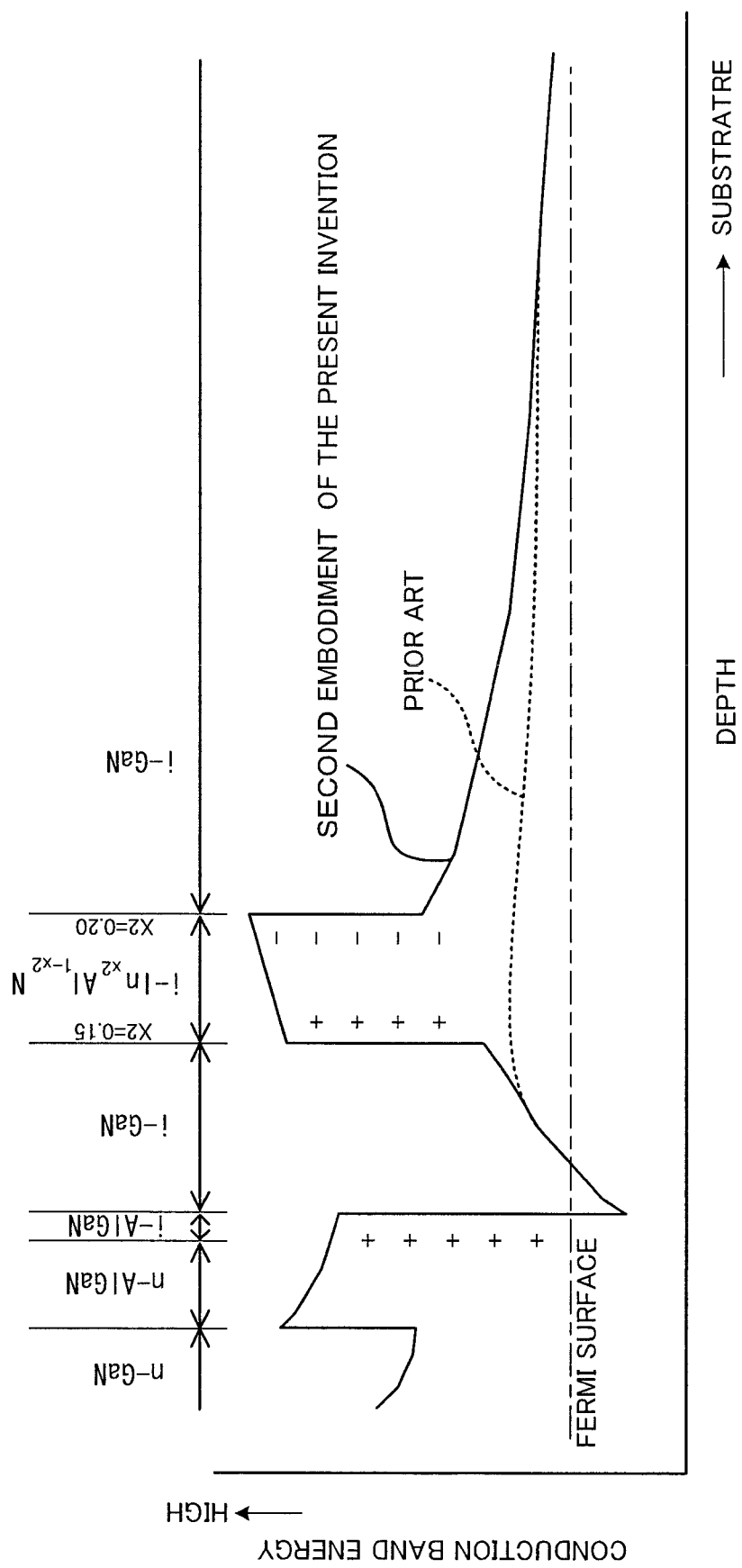

COMPOUND SEMICONDUCTOR DEVICE

CROSS-RELATED APPLICATION

This application claims priority to Japanese Patent Application 2007-94824, filed Mar. 30, 2007, and is fully incorporated herein by reference.

FIELD OF THE INVENTION

The present invention relates to a compound semiconductor device and, more particularly, a compound semiconductor device having a gallium nitride based compound semiconductor layer as an active layer.

BACKGROUND OF THE INVENTION

An electronic device such as a GaN based semiconductor device, in which a GaN layer and an AlGaN layer are grown sequentially over a substrate and the GaN layer is used as a channel layer, has been actively developed. A sapphire substrate, a SiC substrate, a GaN substrate, a silicon substrate and the like are used as a substrate on which the GaN layer is deposited.

The GaN layer has an energy bandgap of 3.4 eV that is larger than that of 1.4 eV of the GaAs layer, and is expected to operate in a higher voltage and withstand a higher voltage.

Japanese Patent Application Publication 2006-114653-A, for example, discloses the GaN High Electron Mobility Transistor (HEMT) as a high withstand-voltage GaN electronic device.

The GaN-HEMT used as an amplifier has a load line characteristic so as to provide high load impedance, and hence can operate very efficiently.

Since the GaN-HEMT exhibits a high power density, and hence a chip size of the GaN-HEMT can be reduced, and a power loss in the amplifier can be reduced. Thus, a cost for managing a small amplifier, which provides large load impedance and easiness of impedance matching, can be reduced.

Because of such advantages, recently the GaN-HEMT is being developed intensively for a communication system at a higher frequency in a milimeter-wavelength band.

The conventional GaN-HEMT has a structure shown in FIG. 9, for example.

In FIG. 9, an AlN layer 102, a GaN layer 103, an n-type AlGaN layer 104, and an n-type GaN layer 105 are formed sequentially on a SiC substrate 101. In this case, the AlN layer 102 and a lower portion of the GaN layer 103 form a buffer layer.

Also, Ohmic-contacts of a source electrode 107s and a drain electrode 107d which are disposed at a distance are formed on the n-type AlGaN layer 104. Also, Schottky-contact of a gate electrode 108 which is disposed at distances between the source electrode 107s and the drain electrode 107d is formed on the n-type GaN layer 105.

Also, a silicon nitride layer 106 is formed as a protection insulating film on the n-type GaN layer 105 and between the source electrode 107s and the drain electrode 107d.

SUMMARY OF THE INVENTION

According an aspect of an embodiment, there is a compound semiconductor device having a transistor structure, including a substrate, a first layer formed over the substrate and comprising GaN, a second layer formed over the first layer and comprising InN whose lattice constant is larger than the first layer, a third layer formed over the second layer and comprising GaN whose energy bandgap is smaller than the second layer, and a channel region layer formed over the third layer.

BRIEF DESCRIPTION OF THE DRAWINGS

The invention will be described in connection with non-limiting embodiments with reference to the accompanying drawings.

FIG. 2 is an electron energy diagram of conduction band in a compound semiconductor layer constituting the compound semiconductor device according to the first embodiment of the present invention;

FIG. 6 is an electron energy diagram of conduction band in a compound semiconductor layer constituting the compound semiconductor device according to the second embodiment of the present invention;

DESCRIPTION OF THE PREFERRED EMBODIMENTS

Embodiments of the present invention will be described in detail with reference to the drawings hereinafter. In the following description, for purposes of explanation, specific nomenclature is set forth to provide a thorough understanding of the various inventive concepts disclosed herein. However, it will be apparent to those skilled in the art that these specific details may not be required in order to practice the various inventive concepts disclosed herein.

Figure 9:
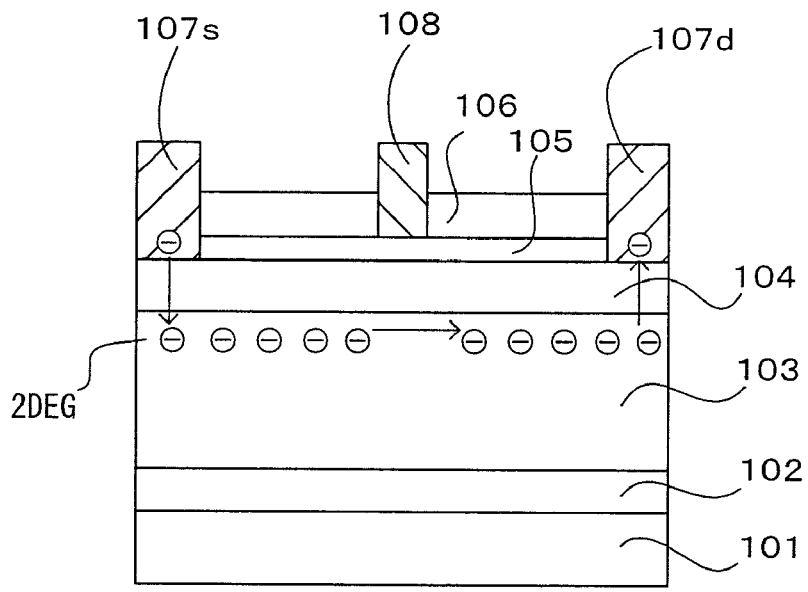
FIG. 9 is a sectional view showing a compound semiconductor device in a conventional technique.

It is needed to shorten a gate length of the gate electrode 108 to about 0.1 μm for the development of a GaN-HEMT for millimeter-wavelength band as shown in FIG. 9. For example, the gate length of the HEMT used in a mobile phone access point or base station is about 0.8 μm in the conventional technique.

However, it is known that, as the gate length is shortened, electrons which are accelerated in the channel region of the GaN layer 103 and have high energy diffuse into the AlN buffer layer 102, so that a current flowing from the source electrode 107s to the drain electrode 107d is hard to turn off.

Figure 10:
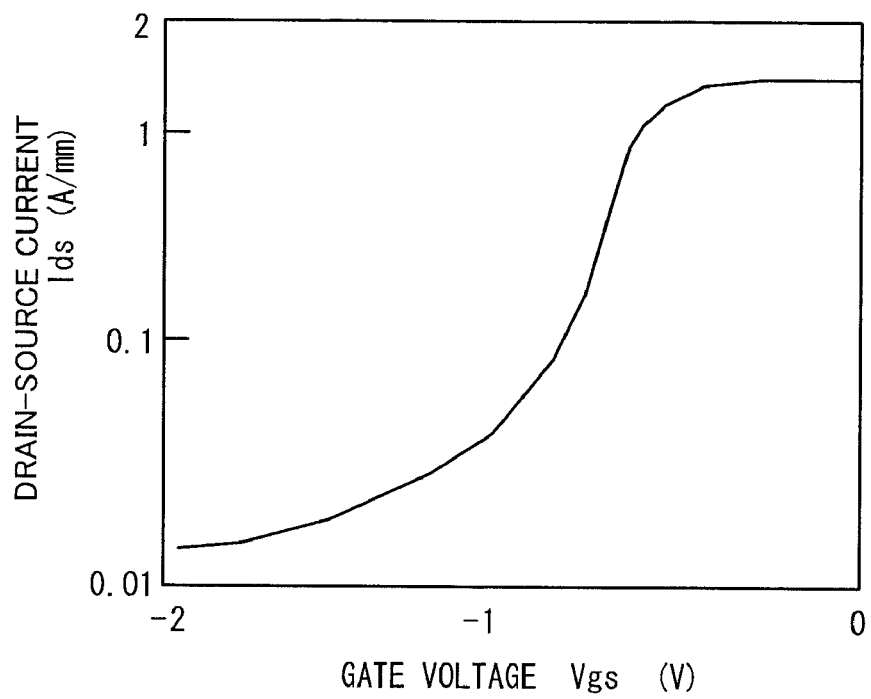
FIG. 10 is a view showing a transistor characteristic curve of the compound semiconductor device in the conventional technique.

As shown in FIG. 10, when a drain-source current $I_{ds}$ cannot be turned off at a threshold of a gate voltage $V_{gs}$, e.g., −1 V, operating efficiency is lowered and also reliability is decreased. When a temperature is changed at the same time, the electrons diffuse further into the buffer side, as temperature rises further. Therefore, an off current is increased and also operating efficiency is lowered further.

The inventors describe the present invention to provide a compound semiconductor device having a structure that makes it easy to turn off a current.

An embodiment a transistor structure comprises a substrate, a first layer formed on the substrate and containing GaN, a second layer formed over the first layer and comprising InN whose lattice constant is larger than the first layer, a third layer formed over the second layer and comprising GaN whose energy bandgap is smaller than the second layer, and a channel region layer formed on the third layer.

According to an embodiment of the present invention, the second layer which is formed below the channel region layer prevents movement of carriers accelerated in a channel region toward the underlying substrate. Thus, it can be made easy to turn off the current flowing between the drain-source regions by a threshold of a gate voltage. Also, even when a temperature is raised, a movement of the carriers toward the buffer can be suppressed.

Embodiments of the present invention will be explained in detail with reference to the drawings hereinafter.

First Embodiment

Figure 1A:
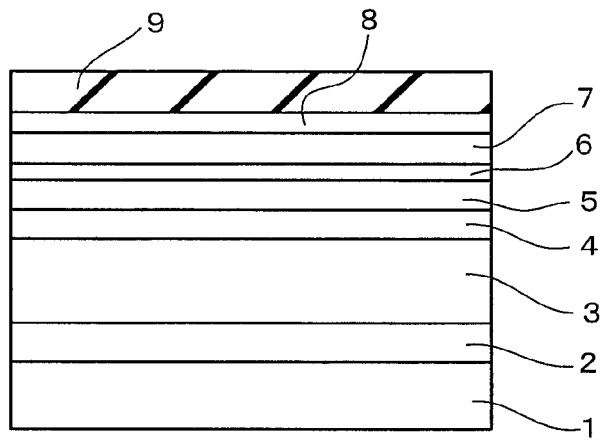
FIGS. 1A to 1C are sectional views showing a compound semiconductor device according to a first embodiment of the present invention and steps of forming the same.
Figure 1B:
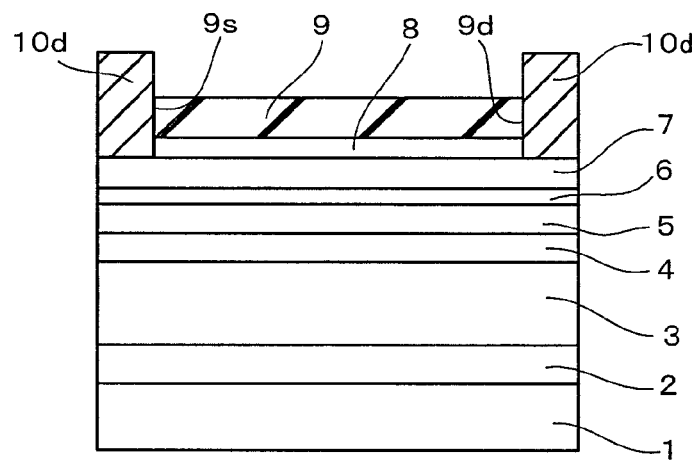
Figure 1C:
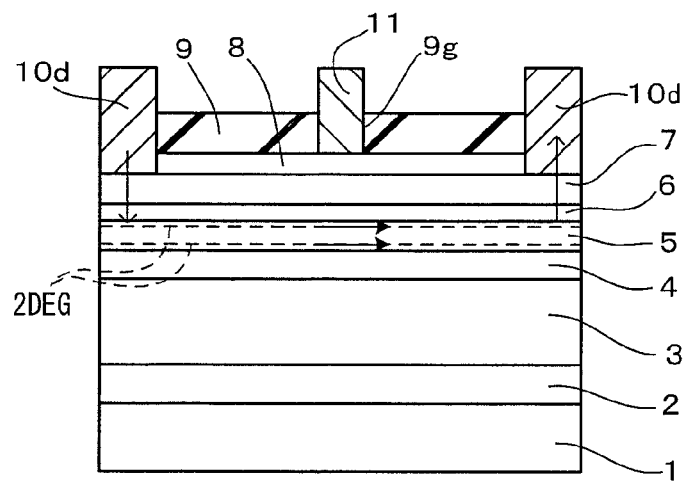

FIGS. 1A to 1C are sectional views showing a compound semiconductor device according to a first embodiment of the present invention and steps of forming the same.

Next, steps required until a layer structure shown in FIG. 1A is formed will be explained hereunder.

First, an AlN layer 2 of 0.3 µm thickness and an undoped GaN layer 3 of 2.5 µm thickness are formed as a buffer layer on a single crystal SiC substrate 1. Then, an undoped $In_{x1}Al_{1-x1}N$ (x1=0.2) layer 4 of 20 nm thickness, an undoped GaN layer 5 of 100 nm thickness, an undoped $Al_{y1}Ga_{1-y1}N$ layer 6 of 5 nm thickness, an n-type $Al_{y1}Ga_{1-y1}N$ layer 7 of 20 nm thickness, and an n-type GaN layer 8 of 7 nm thickness are formed sequentially on the undoped GaN layer 3. In this case, a composition ratio y1 in the $Al_{y1}Ga_{1-y1}N$ layer 6 and the $Al_{y1}Ga_{1-y1}N$ layer 7 is set to 0.33, for example.

Respective layers from the AlN layer 2 to the n-type GaN layer 8 are formed successively by the metal organic vapor-phase epitaxy (MOVPE) method while selecting the material gas respectively.

In this case, trimethylaluminum, trimethylgallium, and trimethylindium are used as the material of aluminum (Al), as the material of gallium (Ga), and as the material of indium (In) respectively. Also, for example, ammonia ($NH_3$) is used as the material of nitrogen (N).

Also, silicon (Si) is doped in the $Al_{y1}Ga_{1-y1}N$ layer 7 at a concentration of $4 \times 10^{18}$ $cm^{-3}$, for example. Also, Si is doped in the n-type GaN layer 8 at a concentration of $5 \times 10^{18}$ $cm^{-3}$, for example. Si is an n-type dopant and, for example, silane is used as the material.

Then, a silicon nitride (SiN) film 9 serving as a protection insulating film is formed on the n-type GaN layer 8 by the plasma CVD method to have a thickness of about 40 nm, for example.

Then, steps required until a layer structure shown in FIG. 1B is formed will be explained below.

First, the silicon nitride film 9 is patterned by the photolithography method. Thus, a source opening portion 9s and a drain opening portion 9d are formed in a source region and a drain region respectively.

Then, the n-type GaN layer 8 is etched by the dry etching through the source opening portion 9s and the drain opening portion 9d. Thus, the $Al_{y1}Ga_{1-y1}N$ layer 7 is exposed from the source opening portion 9s and the drain opening portion 9d. As a gas used in the dry etching, for example, chlorine ($Cl_2$) is used.

Then, a photoresist (not shown) is coated on the silicon nitride film 9 and then exposed/developed. Thus, windows (not shown) are formed on the source opening portion 9s and the drain opening portion 9d respectively. Then, a Ti layer of about 30 nm thickness and an Al layer of about 200 nm thickness are formed sequentially on the photoresist and in the windows by the evaporation method.

Then, the photoresist is removed. Thus, the Ti layer and the Al layer being left in the source opening portion 9s and the drain opening portion 9d respectively are used as a source electrode 10s and a drain electrode 10d.

Then, the Ti layer and the Al layer are annealed at 600° C., for example. Thus, the source electrode 10s and the drain electrode 10d consisting of these metal layers form ohmic-contacts to the n-type AlGaN layer 7.

Then, steps required until a layer structure shown in FIG. 1C is formed will be explained below.

First, the silicon nitride film 9 is patterned by the photolithography method. Thus, a gate opening portion 9g is formed in a predetermined position between the source electrode 10s and the drain electrode 10d at intervals from these electrodes 10s and 10d.

Then, a photoresist (not shown) is coated on the silicon nitride film 9 and is exposed/developed. Thus, a window (not shown) is formed in a region containing the gate opening portion 9g. Then, a nickel (Ni) layer of about 30 nm and a gold (Au) layer of about 400 nm are formed sequentially on the photoresist and the window by the evaporation method.

Then, the photoresist is removed. Thus, the Ni layer and the Au layer left in the gate opening portion 9g are used as a gate electrode 11. Then, the gate electrode 11 forms Schottky-contact to the n-type GaN layer 8.

In the gate electrode 11, a length in the direction from the source electrode 10s to the drain electrode 10d, i.e., a gate length is about 80 nm, for example, and a length perpendicular to the gate length, i.e., a unit gate width is about 50 µm, for example.

In this case, when GaN-HEMT should be separated from the circumstances, an element isolation recess is formed by etching the periphery of the element by using a mask.

As a result, a basic structure of GaN-HEMT is formed.

In the above GaN-HEMT, a conduction band energy structure from the n-type GaN layer 8 just under the gate electrode 11 to the undoped GaN layer 3 is given as shown in FIG. 2.

In FIG. 2, the undoped $In_{x1}Al_{1-x1}N$ (x1=0.2) layer 4 has an energy bandgap larger than those of the undoped GaN layers 3, 5 formed under and on this layer 4 respectively. Also, the undoped GaN layer 5 has an energy bandgap smaller than those of the $Al_{y1}Ga_{1-y1}N$ layers 6 and 7 formed on this layer 5.

Also, high-concentration carriers are generated due to the piezo polarization at a heterojunction interface between the undoped GaN layer 5 and the undoped $Al_{y1}Ga_{1-y1}N$ layer 6, and thus a two-dimensional electron gas (2DEG) is generated. A part of the heterojunction interface on the undoped GaN layer 5 serves as a channel region.

The undoped $In_{x1}Al_{1-x1}N$ (x1=0.2) layer 4 is joined to the underlying undoped GaN layer 3 via the heterojunction, and has a lattice constant larger than the undoped GaN layer 3. Therefore, a lattice mismatching exists between the undoped GaN layer 3 and the undoped $In_{x1}Al_{1-x1}N$ layer 4, and thus a negative piezocharge is caused at the heterojunction interface and the energy band at that interface rises.

The undoped GaN layer 5 has a lattice mismatching with the underlying undoped $In_{x1}Al_{1-x1}N$ (x1=0.2) layer 4, and has a lattice constant smaller than the undoped $In_{x1}Al_{1-x1}N$ (x1=0.2) layer 4.

Thus, a positive piezocharge is caused at the heterojunction interface between the undoped GaN layer 5 and the undoped $In_{x1}Al_{1-x1}N$ layer 4, and the energy band lowers at that interface. As a result, a two-dimensional electron gas is generated in a lower layer portion of the undoped GaN layer 5.

With the above, channel regions are generated in lower and upper interfaces between the undoped GaN layer 5 and the underlying undoped $In_{x1}Al_{1-x1}N$ layer 4 and the overlying undoped $Al_{y1}Ga_{1-y1}N$ layer 6 respectively. As a result, a concentration of the two-dimensional electron gas is increased.

Also, the undoped $In_{x1}Al_{1-x1}N$ layer 4 has an energy bandgap larger than the overlying undoped GaN layer 5 and acts as the carrier barrier layer. Also, the energy band of the area near the substrate 1 rises in the undoped $In_{x1}Al_{1-x1}N$ layer 4.

Accordingly, the electrons being accelerated in the channel region of the undoped GaN layer 5 and having a high energy cannot diffuse into the buffer layer, so that it becomes easy to control a drain-source current $I_{ds}$ by a gate voltage to off.

Figure 3:
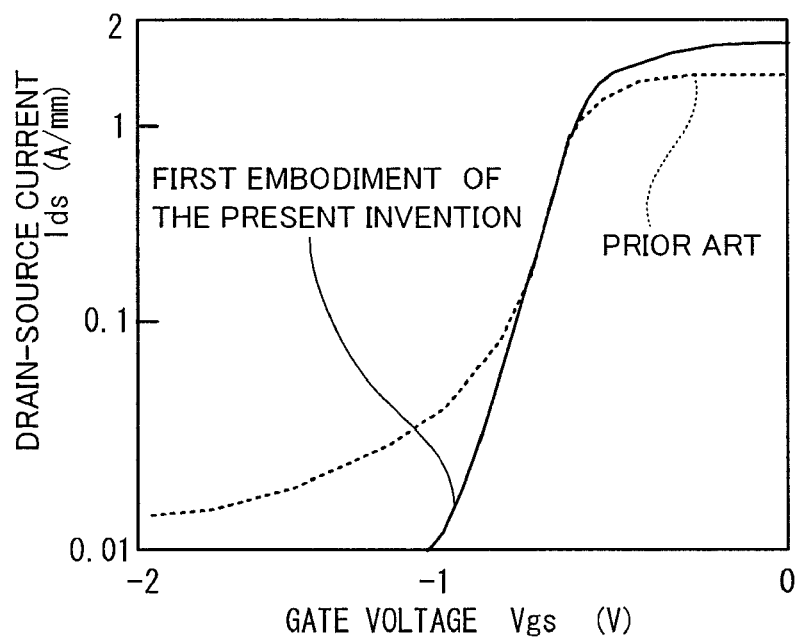
FIG. 3 is a view showing a transistor characteristic curve of the compound semiconductor device according to the first embodiment of the present invention.

When relationships between a gate electrode $V_{gs}$ and a drain-source current $I_{ds}$ have been examined in the GaN-HEMT according to the present embodiment and the GaN-HEMT shown in FIG. 9 in the conventional technique respectively, the characteristic curves have been shown in FIG. 3.

In FIG. 3, according to the GaN-HEMT of the present embodiment, profile of the characteristic curve changes sharply at the pinch-off rather than the conventional GaN-HEMT having no undoped $In_{x1}Al_{1-x1}N$ layer 4. In addition, a maximum value of the drain-source current $I_{ds}$ of the present embodiment is increased by 30% compared to the conventional GaN-HEMT.

Figure 4:
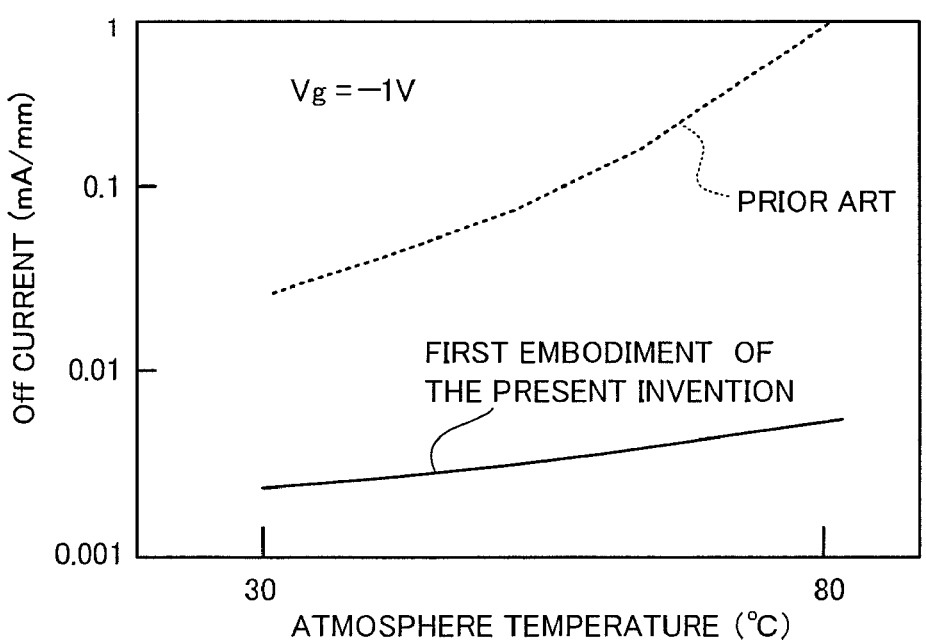
FIG. 4 is a view showing a temperature characteristic of the compound semiconductor device according to the first embodiment of the present invention.

FIG. 4 shows a temperature characteristic data of which temperature characteristic depend on the off current in the first embodiment of the present invention when the gate voltage is selected to −1 V. The off current is increased at a high temperature in the conventional technique, but an increase of the off current can be suppressed in the present invention.

Second Embodiment

Figure 5A:
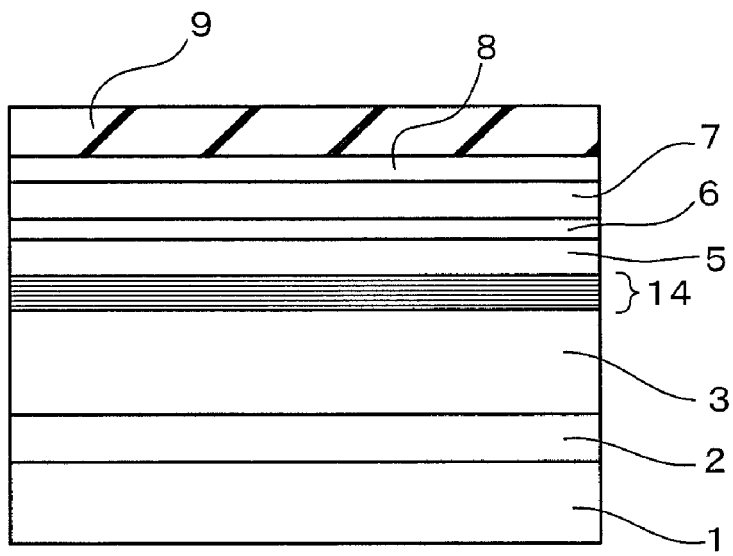
FIGS. 5A and 5B are sectional views showing a compound semiconductor device according to a second embodiment of the present invention and steps of forming the same.
Figure 5B:
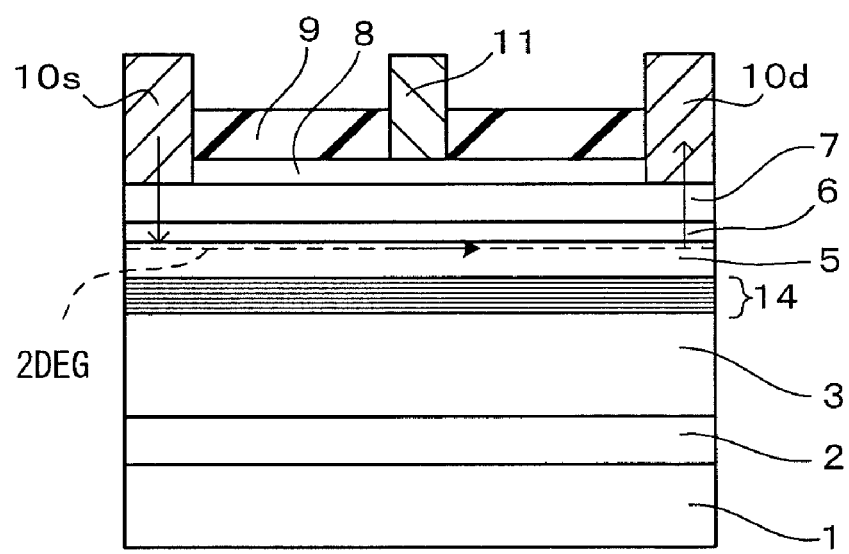

FIGS. 5A and 5B are sectional views showing a compound semiconductor device according to a second embodiment of the present invention and steps of forming the same.

At first, steps required until a layer structure shown in FIG. 5A is formed will be explained hereunder.

First, the AlN layer 2 of 0.3 μm thickness and the undoped GaN layer 3 of 2.5 μm thickness are formed as the buffer layer on the single crystal SiC substrate 1. Then, an undoped $In_{x2}Al_{1-x2}N$ layer 14 whose In composition ratio x2 is changed in the thickness direction and whose thickness is 20 nm, the undoped GaN channel layer 5 of 100 nm thickness, the undoped $Al_{y1}Ga_{1-y1}N$ layer 6 of 5 nm thickness, the n-type $Al_{y1}Ga_{1-y1}N$ layer 7 of 20 nm thickness, and the n-type GaN layer 8 of 7 nm thickness are formed sequentially on the undoped GaN layer 3. In this case, a composition ratio y1 of the $Al_{y1}Ga_{1-y1}N$ layers 6, 7 is set to 0.33, for example.

A composition ratio x2 of the undoped $In_{x2}Al_{1-x2}N$ layer 14 is changed to reduce toward the upper side such that a lowermost layer of the undoped $In_{x2}Al_{1-x2}N$ layer 14 is 0.2 and an uppermost layer thereof is 0.15, for example. A continuous change of the composition is employed herein, but a stepwise change may also be employed.

Here, Si is doped in the n-type $Al_{y1}Ga_{1-y1}N$ layer 7 at a concentration of $4 \times 10^{18}$ cm$^{-3}$, for example. Also, Si is doped in the n-type GaN layer 8 at a concentration of $5 \times 10^{18}$ cm$^{-3}$, for example.

Al, Ga, In, Al, N, and dopants constituting respective layers are supplied by using the same materials as those shown in the first embodiment.

Then, the silicon nitride film 9 is formed as a protection film on the n-type GaN layer 8 by the plasma CVD method to have a thickness of about 40 nm, for example.

Then, steps required until a structure shown in FIG. 5B is formed will be explained hereunder.

First, the silicon nitride film 9 is patterned by the photolithography method. Thus, the source opening portion 9s and the drain opening portion 9d are formed in the source region and the drain region respectively.

Then, the n-type GaN layer 8 is etched through the source opening portion 9s and the drain opening portion 9d by the similar method to the first embodiment. Thus, the n-type $Al_{y1}Ga_{1-y1}N$ layer 7 is exposed from the source opening portion 9s and the drain opening portion 9d.

Then, the source electrode 10s and the drain electrode 10d which form ohmic-contacts to the n-type $Al_{y1}Ga_{1-y1}N$ layer 7 are formed in the source opening portion 9s and the drain opening portion 9d by the similar method to the first embodiment.

Then, the gate opening portion 9g is formed between the source opening portion 9s and the drain opening portion 9d by the similar method to the first embodiment. Then, the gate electrode 11 which forms Schottky-contact to the n-type GaN layer 8 through the gate opening portion 9g is formed in the gate opening portion 9g.

The gate electrode 11 is formed of a two-layered structure consisting of a Ni layer and an Au layer, for example, and is formed in the same size as the first embodiment. Also, each of the source electrode 10s and the drain electrode 10d is formed of a two-layered structure consisting of a Ti layer and an Al layer.

In this case, when the GaN-HEMT should be separated from the circumstances, the element isolation recess is formed by etching the periphery of the element by using a mask.

As a result, a basic structure of the GaN-HEMT is formed.

In the above GaN-HEMT, a conduction band energy band structure from the n-type GaN layer 8 just under the gate electrode 11 to the undoped GaN layer 3 is given as shown in FIG. 6.

In FIG. 6, a two-dimensional electron gas of high-concentration carriers is generated by piezo polarization at the heterojunction interface between the undoped GaN layer 5 and the undoped $Al_{y1}Ga_{1-y1}N$ layer 6. The heterojunction interface on the undoped GaN layer 5 serves as the channel region.

Also, a composition ratio x2 of a lowermost layer of the undoped $In_{x2}Al_{1-x2}N$ layer 14 is 0.2 and a composition ratio x2 of an uppermost layer thereof is 0.15.

Thus, a lattice constant of the undoped $In_{x2}Al_{1-x2}N$ layer 14 is larger than that of the underlying undoped GaN layer 3 but smaller than that of the overlying undoped GaN layer 5. Also, the undoped $In_{x2}Al_{1-x2}N$ layer 14 has an energy bandgap larger than those of the underlying and overlying undoped GaN layers 3, 5.

Because of the relationship of these lattice constants, a lattice mismatching exists between the undoped $In_{x2}Al_{1-x2}N$ layer 14 and the underlying undoped GaN layer 3. Thus, a negative piezocharge is generated at the heterojunction interface between those layers 3 and 14, and the energy band at that interface heightens.

Also, there exists a lattice mismatching between the undoped $In_{x2}Al_{1-x2}N$ layer 14 and the overlying undoped GaN layer 5. In this case, the lattice constant of the undoped GaN layer 5 is larger than that of the undoped $In_{x2}Al_{1-x2}N$ layer 14. Thus, a negative piezocharge is also generated at the heterojunction interface, and the energy band heightens at that interface also.

Therefore, a two-dimensional electron gas is not generated in a lower layer portion of the undoped GaN layer 5 acting as the channel region, but the underlying undoped $In_{x2}Al_{1-x2}N$ layer 14 acts as the barrier. As a result, the electrons being accelerated in the channel region and having a high energy cannot diffuse into the buffer layer, so that it becomes easy to control a drain-source current $I_{ds}$ by a gate voltage to off.

Figure 7:
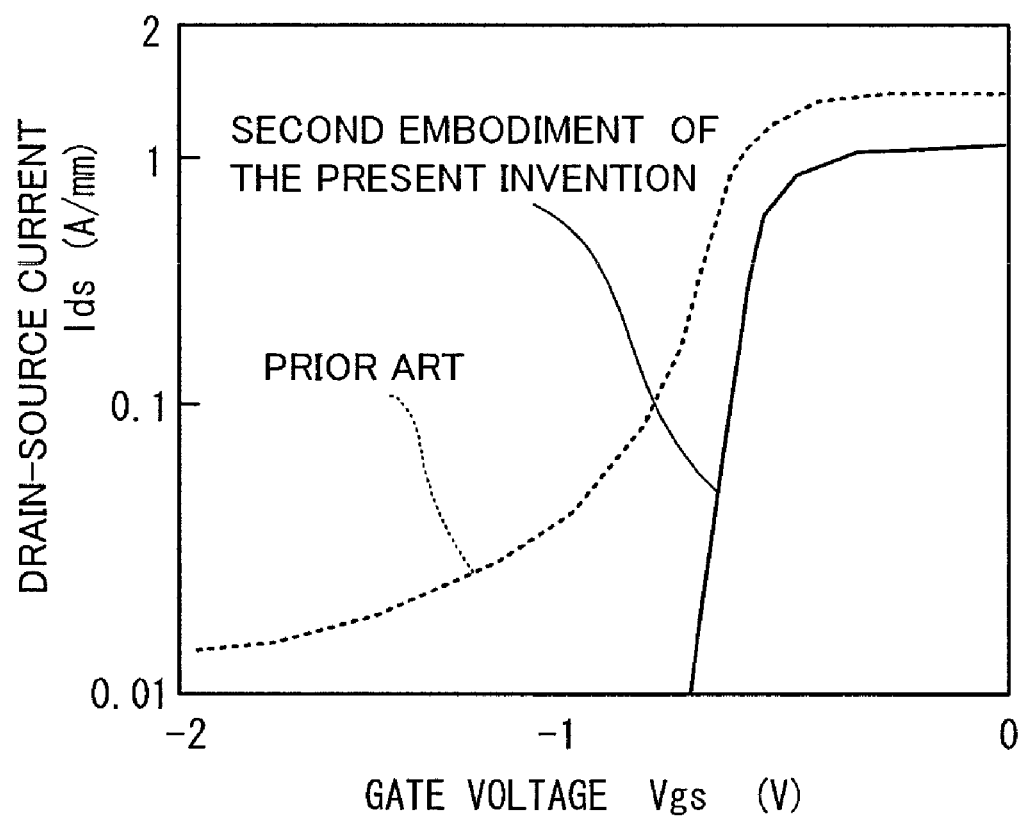
FIG. 7 is a view showing a transistor characteristic curve of the compound semiconductor device according to the second embodiment of the present invention.

When a relationship between the gate electrode $V_{gs}$ and the drain-source current $I_{ds}$ has been examined in the GaN-HEMT according to the present embodiment and the GaN-HEMT shown in FIG. 9 in the conventional technique respectively, a characteristic curve shown in FIG. 7 has been derived.

In FIG. 7, according to the GaN-HEMT of the present embodiment, a profile of the characteristic curve changed sharply at the pinch-off rather than the conventional GaN-HEMT having no undoped $In_{x2}Al_{1-x2}N$ layer.

In this case, a maximum value of the drain-source current $I_{ds}$ of the device in the conventional technique is larger than that of the device of the present embodiment, but the device of the present embodiment can get the better pinch-off characteristic than the GaN-HEMT according to the first embodiment.

Third Embodiment

Figure 8A:
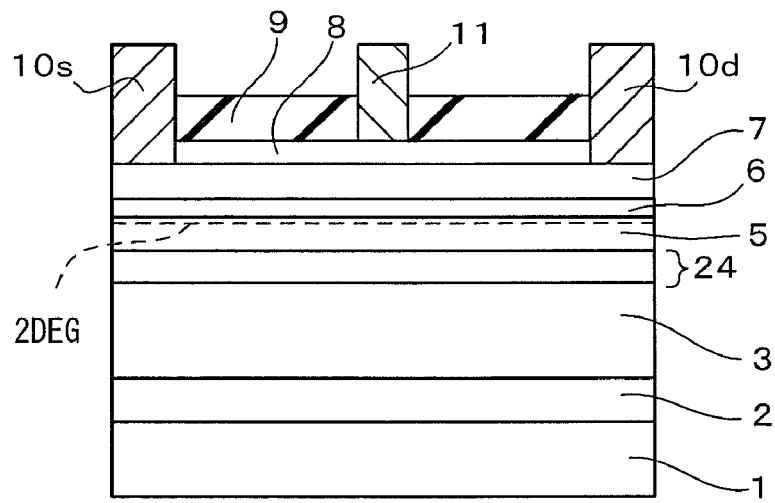
FIG. 8A is a sectional view showing a semiconductor device according to a third embodiment of the present invention.
Figure 8B:
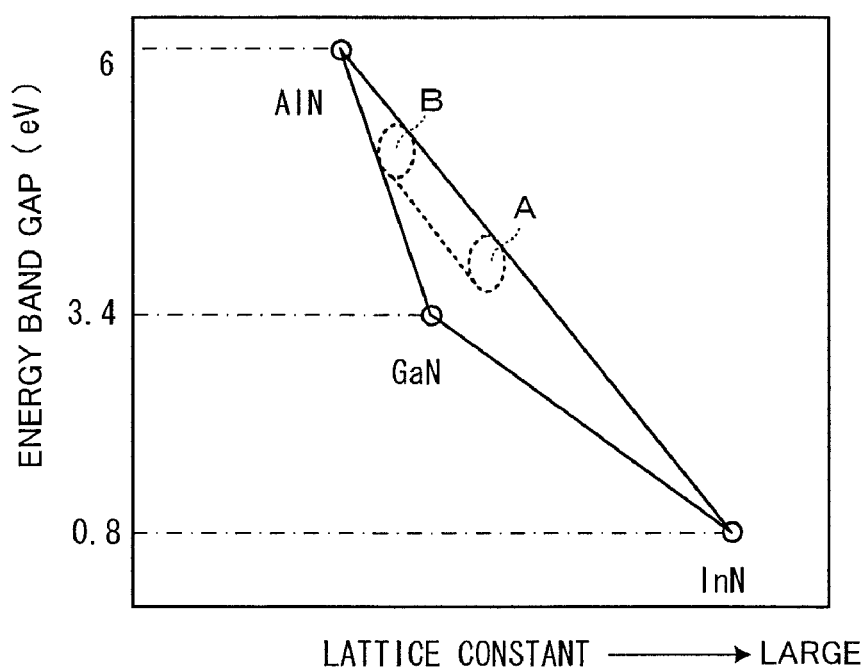
FIG. 8B is a diagram showing a relationship between a lattice constant and an energy band gap of a nitride compound semiconductor.

FIG. 8A is a sectional view showing a semiconductor device according to a third embodiment of the present invention, and FIG. 8B is a diagram showing a relationship between a lattice constant and an energy band gap of a nitride compound semiconductor.

In FIG. 8A, the AlN layer 2 of 0.3 μm thickness, the undoped GaN layer 3 of 2.5 μm thickness, an undoped $(In_xAl_{1-x})_yGa_{1-y}N$ layer 24 of 20 nm thickness, the undoped GaN layer 5 of 100 nm thickness, the undoped $Al_{y1}Ga_{1-y1}N$ layer 6 of 5 nm thickness, the n-type $Al_{y1}Ga_{1-y1}N$ layer 7 of 20 nm thickness, and the n-type GaN layer 8 of 7 nm thickness are formed sequentially on the single crystal SiC substrate 1.

Also, the silicon nitride film 9 is formed as a protection film on the n-type GaN layer 8 to have a thickness of about 40 nm, for example.

Then, the source opening portion 9s and the drain opening portion 9d are formed in the silicon nitride film 9 and the n-type GaN layer 8 at an interval. Then, the source electrode 10s and the drain electrode 10d both which form ohmic-contacts to the n-type $Al_{y1}Ga_{1-y1}N$ layer 7 are formed in the source opening portion 9s and the drain opening portion 9d respectively.

Also, the gate opening portion 9g is formed in the silicon nitride film 9 between the source electrode 10s and the drain electrode 10d at an interval from these electrodes. Also, the gate electrode 11 forms Schottky-contact to the n-type GaN layer 8 via the gate opening portion 9g.

In the present embodiment, the nitride compound semiconductor in which composition ratios x, y of the constitutive elements in the undoped $(In_xAl_{1-x})_yGa_{1-y}N$ layer 24 formed under the undoped GaN layer 5 having the channel region are in ranges of $0<x\leq 1$ and $0<y\leq 1$ and which contains at least InN having the larger energy bandgap than GaN should be employed as the condition.

Also, it is required of a lowermost layer of the undoped $(In_xAl_{1-x})_yGa_{1-y}N$ layer 24 closest to the AlN layer 2 as the buffer layer that a positive piezocharge is never generated due to the piezo polarization.

For example, the composition ratio x of 0.13 to 0.20 is preferable, and the composition ratio y of 0.9 to 0.95 is preferable. In particular, preferably the composition ratio x should be set to such a level that a phase separation is never generated in the undoped $(In_xAl_{1-x})_yGa_{1-y}N$ layer 24.

It is preferable that the undoped $(In_xAl_{1-x})_yGa_{1-y}N$ layer 24 should be set in the area that is surrounded with a broken line based on a relationship between the energy bandgap and the lattice constant shown in FIG. 8B. Hence, a conduction band energy band is brought into a condition that is equal to or like those shown in FIG. 2 and FIG. 6. As a result, it is restricted that the carrier being accelerated in the channel region of the undoped GaN layer 5 moves to the barrier layer, and thus the off control of the drain-source current is facilitated.

In this case, another nitride compound semiconductor layer may be formed between the undoped GaN layer 3 and the undoped $(In_xAl_{1-x})_yGa_{1-y}N$ layer 24 or between the undoped $(In_xAl_{1-x})_yGa_{1-y}N$ layer 24 and the undoped GaN layer 5.

By the way, in the above first to third embodiments, the channel region and the buffer layer are formed of the GaN layer. But a structure containing In in addition to GaN may be formed.

When the GaN-HEMT according to one of the first to third embodiments is employed the amplifier for the milliwave band communication, an efficiency can be enhanced. Such GaN-HEMT has a profound effect that contributes to a development of the milliwave band market.

In the first to third embodiments, the alumina substrate, the silicon substrate, the GaN substrate, or the like may be used instead of the SiC substrate 1.

The embodiments explained above are illustrated merely as the typical example. It is apparent for those skilled in the art that variations, modifications, combinations of the constitutive elements of respective embodiments can be applied. Also, it is apparent for those skilled in the art that various variations can be applied without departing from the principle of the present invention and a scope of the invention set forth in claims.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions described herein is merely illustrative, and the invention can be performed using different or additional of process actions or a different combination or ordering of process actions. As a further example, each feature of one embodiment can be mixed and matched with other features shown in other embodiments. Additionally and obviously, features may be added or subtracted as desired. Accordingly, the invention is not to be restricted except in light of the attached claims and their equivalents.

What is claimed is:

1. A compound semiconductor device having a transistor structure, comprising:
   a substrate;
   a first layer formed on the substrate and comprising GaN;
   a second layer formed over the first layer and formed of undoped materials comprising InN, wherein a lattice constant of the second layer is larger than a lattice constant of the first layer;

a third layer formed over the second layer and comprising GaN, wherein an energy bandgap of the third layer is smaller than an energy bandgap of the second layer; and a channel region layer formed on the third layer.

2. A compound semiconductor device according to claim 1, wherein the lattice constant of the second layer is larger than a lattice constant of the third layer.

3. A compound semiconductor device according to claim 1, wherein an upper portion of the second layer is formed of material with composition ratio which forms a lattice constant smaller than a lattice constant of the third layer.

4. A compound semiconductor device according to claim 1, wherein in the second layer, a lattice constant varies with change in material composition ratio in a film thickness direction.

5. A compound semiconductor device according to claim 4, wherein in the second layer, the lattice constant of the second layer increases toward an upper portion from a lower portion.

6. A compound semiconductor device according to claim 4, wherein in the second layer, the lattice constant of the second layer decreases toward an upper portion from a lower portion.

7. A compound semiconductor device according to claim 1, wherein the channel region layer includes at least portion of the third layer.

8. A compound semiconductor device according to claim 1, wherein the second layer is formed of a $(In_xAl_{1-x})_yGa_{1-y}N$ layer ($0<x \leq 1$, $0<y \leq 1$), wherein x is a first composition ratio, and y is a second composition ratio.

9. A compound semiconductor device according to claim 8, wherein the $(In_xAl_{1-x})_yGa_{1-y}N$ layer is an InAlN layer, the first layer is a GaN layer, and the third layer is a GaN layer.

10. A compound semiconductor device according to claim 8, wherein in $(In_xAl_{1-x})_yGa_{1-y}N$ layer, the first composition ratio x in an upper portion of the second layer is smaller than the first composition ratio x in a lower portion of the second layer.

11. A compound semiconductor device according to claim 1, further comprising:

a fourth layer formed on the channel region layer to generate carriers due to a piezo polarization at an interface to the channel region layer.

12. A compound semiconductor device according to claim 11, further comprising:

a source electrode that ohmic-contacts the fourth layer;

a drain electrode that ohmic-contacts the fourth layer in a region away from the source electrode; and a gate electrode that is formed between the source electrode and the drain electrode and Schottky-contacts the fourth layer.

13. A compound semiconductor device according to claim 12, wherein the fourth layer is an AlGaN layer.

14. A compound semiconductor device according to claim 12, wherein an upper layer portion of the fourth layer, is formed of GaN, and the upper portion of the fourth layer is contacted with the gate electrode.

15. A compound semiconductor device according to claim 12, wherein an n-type dopant is contained in the fourth layer.

16. A compound semiconductor device according to claim 12, wherein an insulating film for covering the fourth layer is formed in regions between the gate electrode and the source electrode and the drain electrode.

17. A compound semiconductor device according to claim 8, the first composition ratio x is from 0.13 to 0.20, and the second composition ratio y is from 0.90 to 0.95.

* * * * *